US008779960B2

(12) United States Patent
Brosio

(10) Patent No.: US 8,779,960 B2
(45) Date of Patent: Jul. 15, 2014

(54) METHOD FOR OPERATING AN ELECTROMECHANICAL ACTUATOR

(75) Inventor: Fulvio Brosio, Turin (IT)

(73) Assignee: GM Global Technology Operations LLC, Detroit, MI (US)

( * ) Notice: Subject to any disclaimer, the term of this patent is extended or adjusted under 35 U.S.C. 154(b) by 127 days.

(21) Appl. No.: 13/173,330

(22) Filed: Jun. 30, 2011

(65) Prior Publication Data

US 2012/0019404 A1 Jan. 26, 2012

(30) Foreign Application Priority Data

Jul. 20, 2010 (GB) .................................. 1012151.5

(51) Int. Cl.
*H03M 1/12* (2006.01)

(52) U.S. Cl.
USPC .......................................... 341/155; 341/157

(58) Field of Classification Search
USPC ................ 341/155, 157; 73/114.01; 318/139
See application file for complete search history.

(56) References Cited

U.S. PATENT DOCUMENTS 5,463,300 A * 10/1995 Oximberg .................... 318/801
6,310,452 B1 * 10/2001 Deck et al. .................... 318/273
6,467,338 B1 * 10/2002 Irle et al. .................... 73/114.01
6,498,975 B1 12/2002 Lee et al.
6,965,339 B2 * 11/2005 Midya et al. .................. 341/163
7,032,549 B1 4/2006 Verner et al.
7,126,463 B2 10/2006 Bauerle et al.
7,411,368 B2 * 8/2008 Kang et al. .................... 318/599
8,064,158 B1 * 11/2011 Carter et al. ............... 360/78.12
8,067,927 B2 * 11/2011 Wu et al. ...................... 323/283
8,106,618 B2 * 1/2012 Fabis et al. .................... 318/661
8,169,112 B2 * 5/2012 Zhang ......................... 310/68 B
8,390,240 B2 * 3/2013 Stancu et al. ................. 318/799
2005/0109111 A1 5/2005 Manlove et al.

* cited by examiner

*Primary Examiner* — Brian Young
(74) *Attorney, Agent, or Firm* — Ingrassia Fisher & Lorenz, P.C.

(57) ABSTRACT

A method is provided for operating an electromechanical actuator comprising a movable element, a position sensor for detecting the position of the movable element, a logic unit connected to the position sensor, and exactly one output line for the logic unit to transmit a pulse width modulated (PWM) signal having a predetermined frequency value, the method providing for the logic unit to perform detecting a position of the movable element, determining a value of a duty cycle of the pulse width modulated (PWM) signal on the basis of the detected position of the movable element, and transmitting a pulse width modulated (PWM) signal indicative of the position of the movable element having the determined value of the duty cycle.

6 Claims, 2 Drawing Sheets

METHOD FOR OPERATING AN ELECTROMECHANICAL ACTUATOR

CROSS-REFERENCE TO RELATED APPLICATION

This application claims priority to British Patent Application No. 1012151.5, filed Jul. 20, 2010, which is incorporated herein by reference in its entirety.

TECHNICAL FIELD

The technical field relates to a method for operating an electromechanical actuator, in particular an electromechanical actuator of a motor vehicle comprising an electronic control unit for controlling the actuator operation.

BACKGROUND

Modern motor vehicles comprise a network of electromechanical actuators controlled by a central electronic control unit, or by a subsidiary control unit connected to the central one, by means of communication bus data lines. The information relative to the operation and to the actual position of the actuators are transmitted by the actuators to the central or subsidiary control unit using different protocols of communication, such a controller area network (CAN) or a local interconnecting network (LIN) data bus. The above named kind of data bus works properly but they both require expensive and complicated hardware to operate.

A different solution provides for connecting each actuator and the central, or the subsidiary, control unit through a discrete output line and for transmitting the information data, from the actuator to the control unit. According to this solution the information data are transmitted using a pulse width modulated (PWM) signal with a fixed duty cycle while coding the information data, indicative of the correct operation of the actuator, varying a frequency value of the pulse width modulated (PWM) signal. This solution has the drawback to allow the transmission of only one kind of information data for each line. As a consequence, two lines must be provided if there is the need to transmit information relating both the correct operation of the actuator and its actual position.

At least a first object is to provide a method for operating an actuator allowing the transmission of information data between a network of actuators and a central unit which does not require a complicate and expensive hardware to operate. At least a further object is to provide a method for operating an actuator allowing the transmission of information data between a network of actuators and a central unit using exactly one discrete line wherein a plurality of different information data are communicated using a single PWM signal.

SUMMARY

A first embodiment provides a method for operating an electromechanical actuator, the electromechanical actuator comprising a movable element, a position sensor for detecting the position of the movable element, a logic unit connected to the position sensor, and exactly one output line for the logic unit to transmit a pulse width modulated (PWM) signal having a predetermined frequency value, the method providing for the logic unit to perform the steps of: detecting a position of the movable element, determining a value of a duty cycle of the pulse width modulated (PWM) signal on the basis of the detected position of the movable element, transmitting a pulse width modulated (PWM) signal indicative of the position of the movable element having the determined value of the duty cycle.

According to a first embodiment the value of the duty cycle is determined by means of a data set correlating different positions of the movable element to different values of the duty cycle of the pulse width modulated (PWM) signal. A further embodiment provides for the logic unit to perform the further steps of: detecting an actuator fault, determining a frequency value of the pulse width modulated (PWM) signal on the basis of the fault of the actuator, varying the frequency value of the transmitted pulse width modulated (PWM) signal to the value corresponding to the detected fault.

Another embodiment has the advantage to allow the logic unit to transmit simultaneously both an information indicative of a fault detection of the actuator and an information indicative of the actual position of the movable element of the actuator within the same pulse width modulated (PWM) signal.

An embodiment provides an electromechanical actuator comprising a movable element, a position sensor for detecting the actual position of the movable element, a logic unit connected to the position sensor and exactly one output line for transmitting a pulse width modulated (PWM) signal indicative of the actual position of the movable element.

The method can be realized in the form of a computer program comprising a program-code to carry out all the steps of the method of the invention and in the form of a computer program product comprising means for executing the computer program. The computer program product comprises, according to a preferred embodiment of the invention, a control apparatus for an IC engine, for example the ECU of the engine, in which the program is stored so that the control apparatus defines the invention in the same way as the method. In this case, when the control apparatus executes the computer program all the steps of the method according to the invention are carried out. The method according to the invention can be also realized in the form of an electromagnetic signal, said signal being modulated to carry a sequence of data bits which represent a computer program to carry out all steps of the method. The invention further provides an internal combustion engine specially arranged for carrying out the method.

BRIEF DESCRIPTION OF THE DRAWINGS

The present invention will hereinafter be described in conjunction with the following drawing figures, wherein like numerals denote like elements, and.

DESCRIPTION

The following detailed description is merely exemplary in nature and is not intended to limit application and uses. Furthermore, there is no intention to be bound by any theory presented in the preceding background or summary or the following detailed description.

Figure 1:
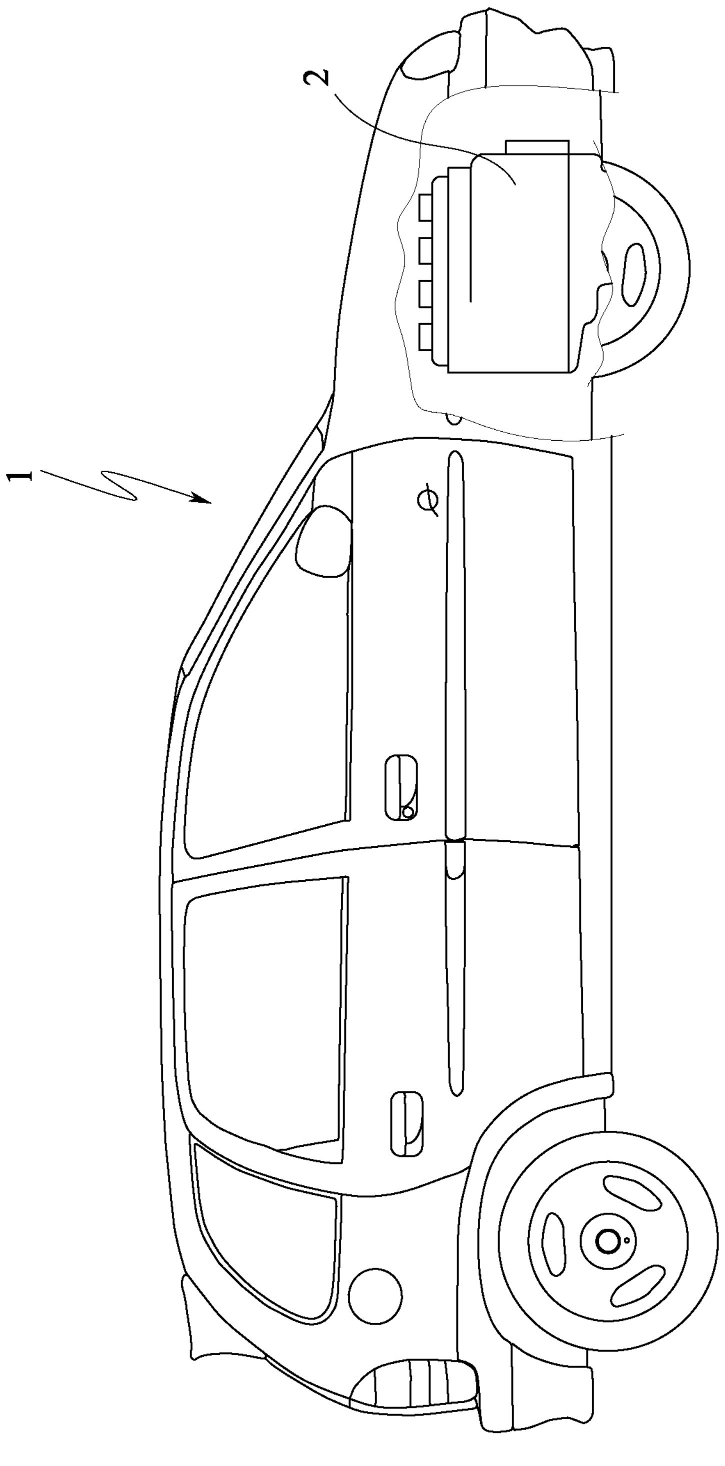
FIG. 1 is a schematic representation of a motor vehicle in which the method is actuated.
Figure 2:
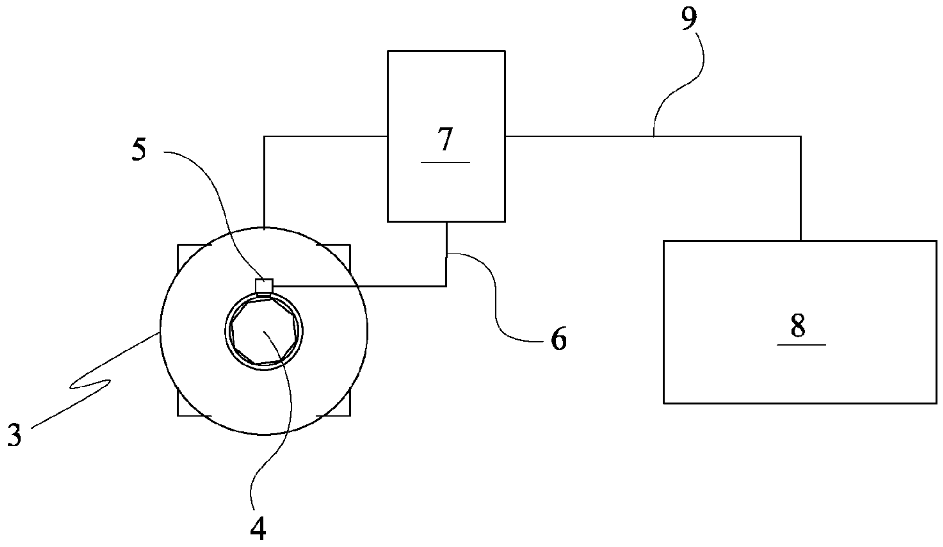
FIG. 2 shows a schematic illustration of a connection between an electronic control unit and an electromechanical actuator.

A first embodiment now described with reference to the accompanying drawings. FIG. 1 shows a motor vehicle 1 provided with an internal combustion engine 2, and a plurality of electromechanical actuators, one of which is shown in FIG. 2 with the reference number 3. The actuator 3 comprises a movable element 4, for instance an electric motor having a rotating shaft, whose actual position is detected by a position sensor 5 associated to the actuator 3. The operation of the actuator 3 is controlled by a logic unit 7, provided in the actuator 3 itself.

The logic unit 7 is connected, by means of a line 6, to a position sensor 5 and, by means of exactly one output line 9, to an electronic control unit 8, such as, for instance, the ECU or another subsidiary control unit of the motor vehicle 1. The electronic control unit 8 has the function to govern, through the logic unit 7, the operation of the actuator 3. In particular, the logic unit 7 and the control unit 8 are provided with embedded known means (not illustrated) for generating, transmitting and receiving a pulse width modulated (PWM) signal carrying the information data necessary for the operation of the actuator 3 and for controlling its correct operation.

During the operation of the actuator the logic unit 7 detects an actual position of the movable element 4 receiving, from the position sensor 5, a signal indicative of the actual position of the movable element 4 of the actuator 3. Once the actual position, of the movable element 4, has been detected, the logic unit 7 determines a value of a duty cycle of the pulse width modulated (PWM) signal on the basis of the detected position of the movable element 4, and it transmits to the control unit 8 a pulse width modulated (PWM) signal indicative of the position of the movable element 4 having the determined value of the duty cycle. Preferably the determination of a duty cycle of the pulse width modulated (PWM) signal is performed providing a data set correlating different values of the duty cycle of the pulse width modulated (PWM) signal with different positions of the movable element 4 of the actuator 3.

In detail, the data set is stored in the logic unit 7 and in the electronic control unit 8. In this way each predetermined duty cycle value is indicative of a different position of the movable element 4, i.e., for instance of the shaft of the electric motor. The logic unit 7 identifies, in the data set, the value of the duty cycle corresponding to the actual position of the movable element 4 and selects the corresponding value of the duty cycle of the pulse width modulated (PWM) signal, transmitted to the control unit 8, according to the data set.

Another embodiment provides also for using a predetermined frequency value of the pulse width modulated (PWM) signal as indicative of the correct operation of the actuator and for varying the frequency value on the basis of a kind of fault of the actuator 3. To this scope the logic unit 7 is provided with a known fault detection procedure for detecting a fault in the actuator 3. Once the fault has been detected, the logic unit 7 determines a frequency value of the pulse width modulated signal on the basis of the detected fault of the actuator 3, and it varies the frequency value of the pulse width modulated signal, transmitted to the control unit 8, to a value indicative of the detected fault. This provides the possibility of transmitting, at the same time, to the central unit 8 an information data indicative of the actual position of the movable element 4 and of the correct operation of the actuator 3 with only a pulse width modulated (PWM) signal.

Figure 3:
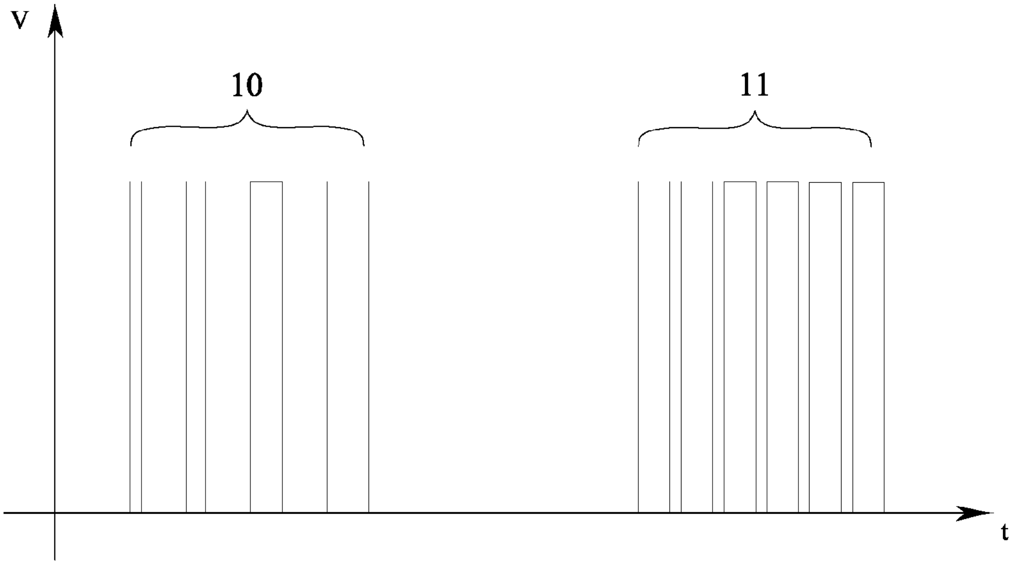
FIG. 3 shows an example of a PWM signal transmitted in different operating condition.

FIG. 3 shows two wave trains 10 and 11 of the pulse width modulated (PWM) signal, wherein the first wave train 10 displays an example of pulse width modulated (PWM) signal during normal operation of the actuator 3, while the second wave train 11 is an example of a pulse width modulated (PWM) signal when a fault of the actuator 3 has been detected. In this last case the duty cycle of the pulse width modulated (PWM) signal is constant, which means that the movable element 4 is blocked, while the frequency of the pulse width modulated (PWM) signal has been changed to a predetermined frequency value indicative of the kind of the detected fault.

While at least one exemplary embodiment has been presented in the foregoing summary and detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing summary and detailed description will provide those skilled in the art with a convenient road map for implementing an exemplary embodiment, it being understood that various changes may be made in the function and arrangement of elements described in an exemplary embodiment without departing from the scope as set forth in the appended claims and their legal equivalents.

What is claimed is:

1. A method for operating an electromechanical actuator comprising a movable element, a position sensor configured to detect a position of the movable element, a logic unit connected to the position sensor, and one output line configured for the logic unit to transmit a pulse width modulated (PWM) signal having a predetermined frequency value, the method performed by the logic unit and comprising:

- detecting the position of the movable element;
- determining a value of a duty cycle of the pulse width modulated (PWM) signal on a basis of the position of the movable element; and
- transmitting the pulse width modulated (PWM) signal indicative of the position of the movable element having the value of the duty cycle.

2. A method according to claim 1, wherein determining the value of the duty cycle comprising determining by means of a data set correlating different positions of the movable element to different values of the duty cycle of the pulse width modulated (PWM) signal.

3. A method according to claim 1, the method further comprising:

- detecting an actuator fault;
- determining a frequency value of the pulse width modulated (PWM) signal on a basis of the actuator fault of the electromechanical actuator; and
- varying the frequency value of the pulse width modulated (PWM) signal to the value corresponding to the actuator fault.

4. A non-transitory computer readable medium embodying a computer program product, said computer program product comprising:

- a program for operating an electromechanical actuator comprising a movable element, a position sensor configured to detect a position of the movable element, a logic unit connected to the position sensor, and one output line configured for the logic unit to transmit a pulse width modulated (PWM) signal having a predetermined frequency value, the program configured to:
- detect the position of the movable element;
- determine a value of a duty cycle of the pulse width modulated (PWM) signal on a basis of the position of the movable element; and
- transmit the pulse width modulated (PWM) signal indicative of the position of the movable element having the value of the duty cycle.

5. The non-transitory computer readable medium embodying the computer program product according to claim 4, wherein the program is configured to determine by means of a data set correlating different positions of the movable element to different values of the duty cycle of the pulse width modulated (PWM) signal.

6. The non-transitory computer readable medium embodying the computer program product to claim 4, the program further configured to:

detect an actuator fault;

determine a frequency value of the pulse width modulated (PWM) signal on a basis of the actuator fault of the electromechanical actuator; and vary the frequency value of the pulse width modulated (PWM) signal to the value corresponding to the actuator fault.

* * * * *